US007638948B2

(12) United States Patent
Descarries et al.

(10) Patent No.: US 7,638,948 B2
(45) Date of Patent: Dec. 29, 2009

(54) APPARATUS AND METHOD FOR DETECTING FAILURE IN AN EMERGENCY LIGHTING LAMPHEAD

(75) Inventors: Camille Descarries, Montreal (CA); Christian Briere, Terrebonne (CA)

(73) Assignee: Thomas & Betts International, Inc., Wilmington, DE (US)

( * ) Notice: Subject to any disclaimer, the term of this patent is extended or adjusted under 35 U.S.C. 154(b) by 206 days.

(21) Appl. No.: 11/856,412

(22) Filed: Sep. 17, 2007

(65) Prior Publication Data

US 2008/0116825 A1    May 22, 2008

Related U.S. Application Data

(60) Provisional application No. 60/860,357, filed on Nov. 21, 2006.

(51) Int. Cl.
*H05B 37/00* (2006.01)
(52) U.S. Cl. .................. 315/86; 315/291; 315/129; 315/131; 315/307; 315/308; 340/458; 340/514; 340/856.3; 340/693.4; 340/642; 702/183
(58) Field of Classification Search .............. 315/86, 315/120–133, 225, 291, 307, 308, 312; 340/514, 340/516, 471, 455, 458, 642, 661, 693.1–693.4, 340/855.8, 855.9, 856.3; 702/183, 60, 63
See application file for complete search history.

(56) References Cited

U.S. PATENT DOCUMENTS

| 4,349,863 A | 9/1982 | Petersen |
|---|---|---|
| 4,451,822 A | 5/1984 | Verse et al. |
| 4,528,456 A | 7/1985 | Nelson et al. |
| 4,544,910 A | 10/1985 | Hoberman |
| 4,799,039 A | 1/1989 | Balcom et al. |
| 4,945,280 A | 7/1990 | Beghelli |
| 4,977,353 A | 12/1990 | Helal et al. |
| 5,148,158 A | 9/1992 | Shah |
| 5,154,504 A | 10/1992 | Helal et al. |
| 5,574,423 A | 11/1996 | Vosika et al. |
| 5,633,564 A | 5/1997 | Edwards et al. |
| 5,666,029 A | 9/1997 | McDonald |
| 5,805,061 A * | 9/1998 | Fritz et al. .................. 340/471 |
| 5,811,975 A | 9/1998 | Bernardo |
| 5,859,499 A | 1/1999 | McAfee et al. |
| 5,966,069 A | 10/1999 | Zmurk et al. |
| 6,285,132 B1 | 9/2001 | Conley, III et al. |
| 6,392,349 B1 | 5/2002 | Crenshaw |
| 6,502,044 B1 * | 12/2002 | Lane et al. .................. 702/63 |
| 6,538,568 B2 | 3/2003 | Conley, III |
| 6,577,136 B1 | 6/2003 | Marques |
| 6,756,736 B2 | 6/2004 | Crenshaw |
| 6,788,000 B2 | 9/2004 | Appelberg et al. |

* cited by examiner

*Primary Examiner*—Haissa Philogene
(74) *Attorney, Agent, or Firm*—Hoffman & Baron, LLP

(57) ABSTRACT

An apparatus and method adapted to detect a failure in at least one lamphead of an emergency lighting system includes a signal generator and a failure sensor. The lamphead receives power from a power connection. The signal generator generates a monitoring signal having a voltage, which is operatively coupled to the power connection. The failure sensor detects a failure in the lamphead and modifies the voltage of the monitoring signal. The emergency lighting system may also include a plurality of lampheads. In this case, the failure sensor may detect a failure in at least one of the lampheads, and identify which of the plurality of lampheads has failed. The failure sensor may also be adapted to reduce the voltage of the monitoring signal in response to detection of the failure.

20 Claims, 3 Drawing Sheets

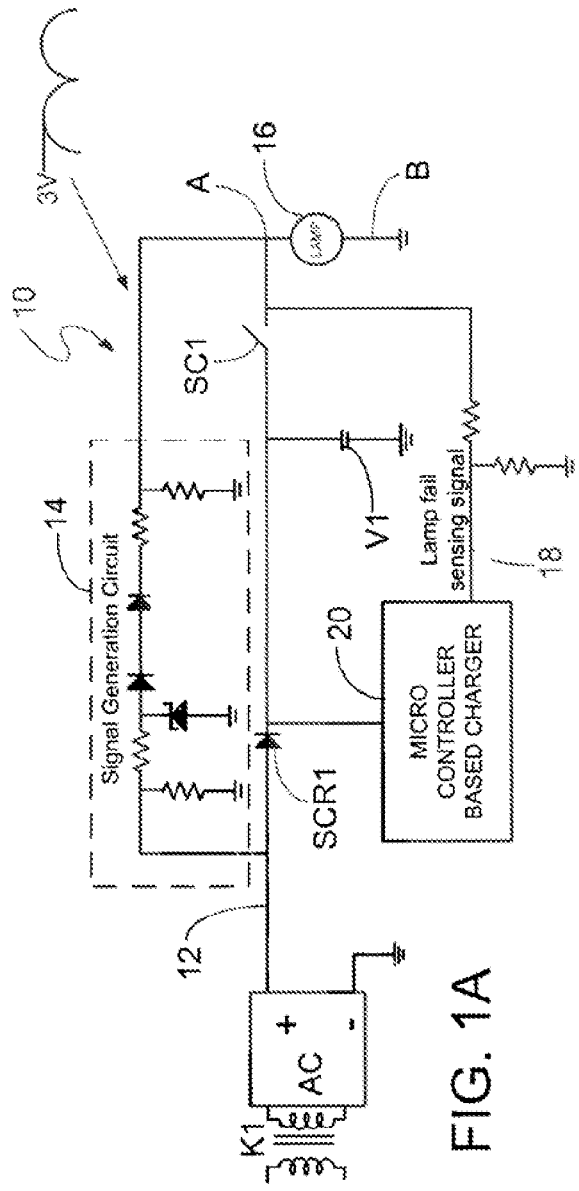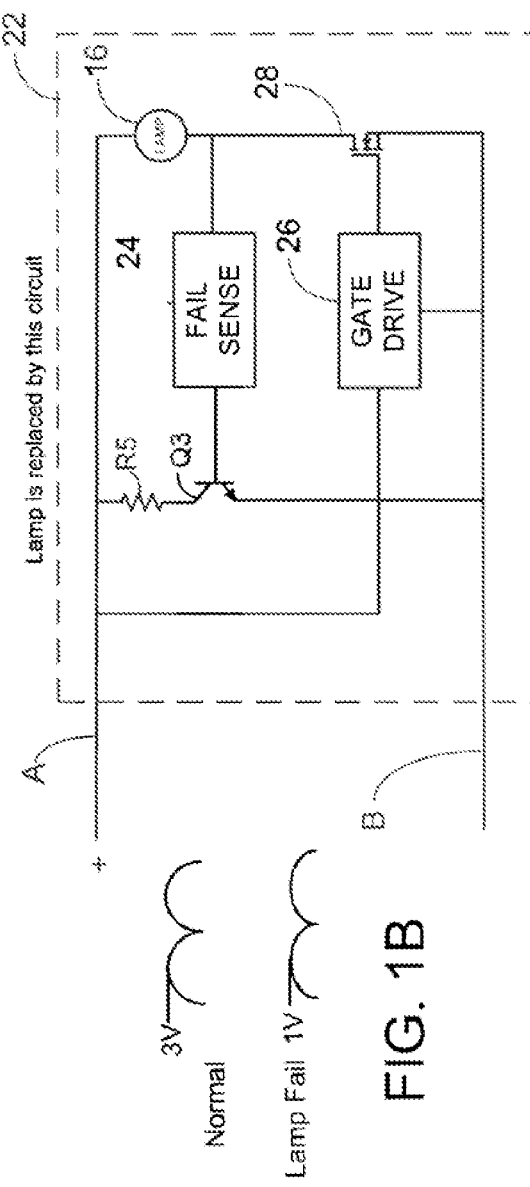
FIG. 1A
FIG. 1B

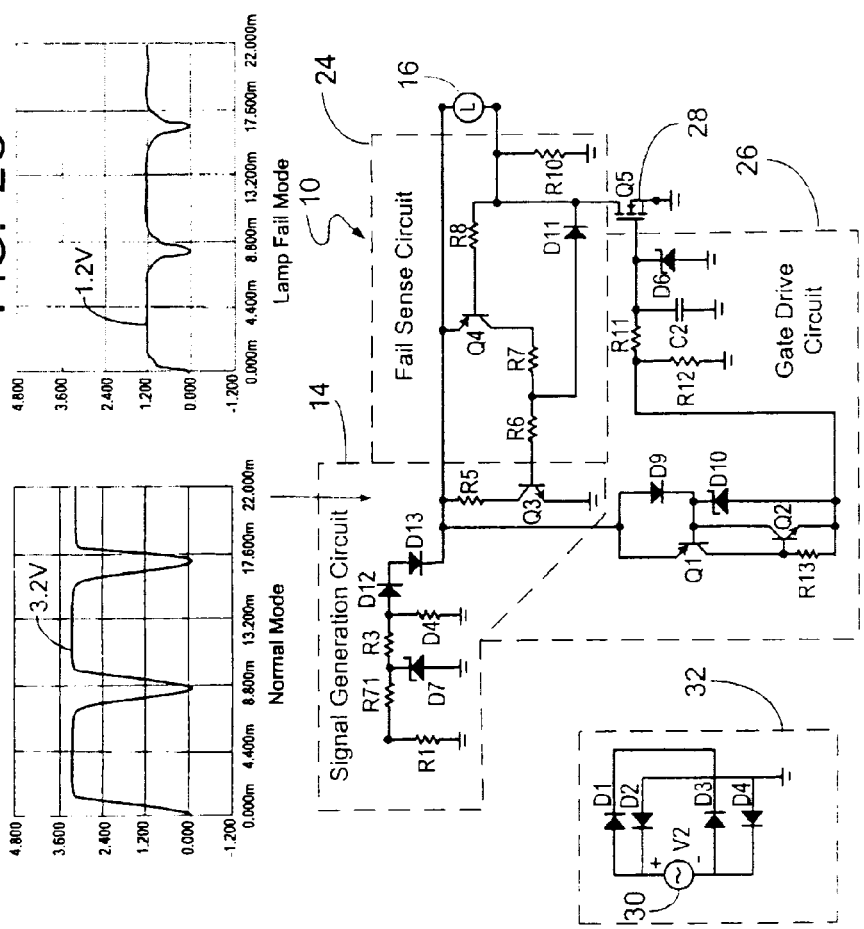

APPARATUS AND METHOD FOR DETECTING FAILURE IN AN EMERGENCY LIGHTING LAMPHEAD

CROSS-REFERENCE TO RELATED APPLICATION

This application claims the benefit of U.S. Provisional Patent Application No. 60/860,357 filed Nov. 21, 2006, the disclosure of which is incorporated herein by reference.

BACKGROUND OF THE INVENTION

1. Field of the Invention

The present invention generally relates to a diagnostic circuit for use with emergency lighting. In particular, the present invention identifies failures in remotely located emergency lighting lampheads.

2. Description of the Prior Art

Emergency lighting is used in many types of facilities to provide DC battery-powered lighting in the event the main AC power supply is temporarily inoperative. Examples of these facilities include schools, hospitals, government offices, hotels, motels, industrial buildings, multiple unit dwellings, shopping malls, and airports. In many cases, these structures are very large and require that emergency lampheads be placed at several different locations to provide adequate coverage. Fire safety codes typically require that emergency lighting be tested periodically to ensure proper operation during an emergency. With a system employing many separate lampheads at scattered locations, these tests become labor intensive and time consuming.

Emergency lighting systems ordinarily include a battery to supply temporary power to one or more lampheads during an AC power loss, a charger for charging the battery from the AC power supply during standby operation, and a relay or other type of switching device for connecting the lampheads to the battery during loss of AC power. If diagnostic circuitry is provided in a central unit rather than in the remote lamphead, testing for proper battery and charger operation is facilitated. However, centrally located diagnostics make it difficult to check for proper operation of individual lampheads. Specifically, problems that can cause failure in particular lampheads include a defective, burned out, or improperly connected lamp or wire, which is difficult to detect from a central location.

In addition, remote lampheads that are connected to each other and the central battery and charging unit in a parallel "daisy chain" arrangement make it difficult for a diagnostic circuit located at the central unit to perform separate tests on each lamphead to identify the specific lamphead that requires service. Thus, if the central monitoring or diagnostic circuit merely shows that one of the lampheads is inoperable, but does not specify the identity or location of that lamphead, the system must be placed in emergency mode to visually identify the inoperable lamphead.

Determining operability at remote lampheads is also difficult since there is a need to minimize the number of lines between the remote lampheads and the central monitoring unit. Therefore, connecting additional wires between the remote lampheads and the central monitoring unit to support diagnostic functions adds to the cost of the system and increases the potential for additional failures. Further, the expense and complexity of diagnostic circuitry is ordinarily such that it is not practical to replicate the required circuitry at each remote lamphead.

Therefore, it is desirable to provide a diagnostic apparatus and method that can readily determine whether a failure exists in an emergency lighting system and can identify the particular lamphead that has failed.

SUMMARY OF THE INVENTION

An apparatus adapted to detect a failure in at least one lamphead of an emergency lighting system formed in accordance with one form of the present invention, which incorporates some of the preferred features, includes a signal generator and a failure sensor. The lamphead receives power from a power connection. The signal generator generates a monitoring signal having a voltage, which is operatively coupled to the power connection. The failure sensor is adapted to detect a failure in the at least one lamphead and modify the voltage of the monitoring signal.

The emergency lighting system may also include a plurality of lampheads. In this case, the failure sensor may be adapted to detect a failure in at least one of plurality of lampheads and identify which of the plurality of lampheads has failed. The failure sensor may also be adapted to reduce the voltage of the monitoring signal in response to detection of a failure in the lamphead. The apparatus is coupled to the power connection without additional wiring to indicate failure in the lamphead, and the power connection preferably includes only two power cables.

The monitoring signal may include a pulsed and/or time-varying signal, and the failure sensor may include a microcontroller. Thee failure sensor may be adapted to encode information associated with failure in the lamphead on a power signal. The monitoring signal may be filtered to reduce false indications of failure in the lamphead, and the apparatus may be adapted to operate with 6-24 volts.

A method adapted to detect a failure in at least one lamphead of an emergency lighting system formed in accordance with one form of the present invention, which incorporates some of the preferred features, wherein the lamphead receives power from a power connection, includes generating a monitoring signal including a voltage, coupling the monitoring signal operatively to the power connection, detecting a failure, and modifying the voltage of the monitoring signal in response to detection of the failure.

The method may include detecting a failure in at least one of plurality of lampheads, and identifying which of the plurality of lampheads has failed. The method may further include reducing the voltage of the monitoring signal in response to detection of the failure 14. The method may include coupling the apparatus to the power connection without additional wiring to enable indication of failure in the lamphead. The power connection may include two power cables, and the monitoring signal may include a pulsed signal and/or time-varying signal. The failure sensor may include a microcontroller, and the method may include encoding information on a power signal associated with failure in the lamphead. The method may also include filtering the monitoring signal to reduce false indications of failure in the lamphead, and operating the apparatus with 6 volts to 24 volts.

These and other objects, features, and advantages of this invention will become apparent from the following detailed description of illustrative embodiments thereof, which is to be read in connection with the accompanying drawings.

BRIEF DESCRIPTION OF THE DRAWINGS

FIGS. 1A and 1B are block diagrams of a failure detection system in accordance with the present invention adapted to be used in an emergency lighting system.

FIG. 2A is a schematic diagram of a failure detection circuit adapted for use in an emergency lighting system.

FIGS. 2B and 2C show waveforms of a monitoring signal in normal mode and lamp failure mode, respectively.

DETAILED DESCRIPTION OF THE PREFERRED EMBODIMENTS

Figure 3:
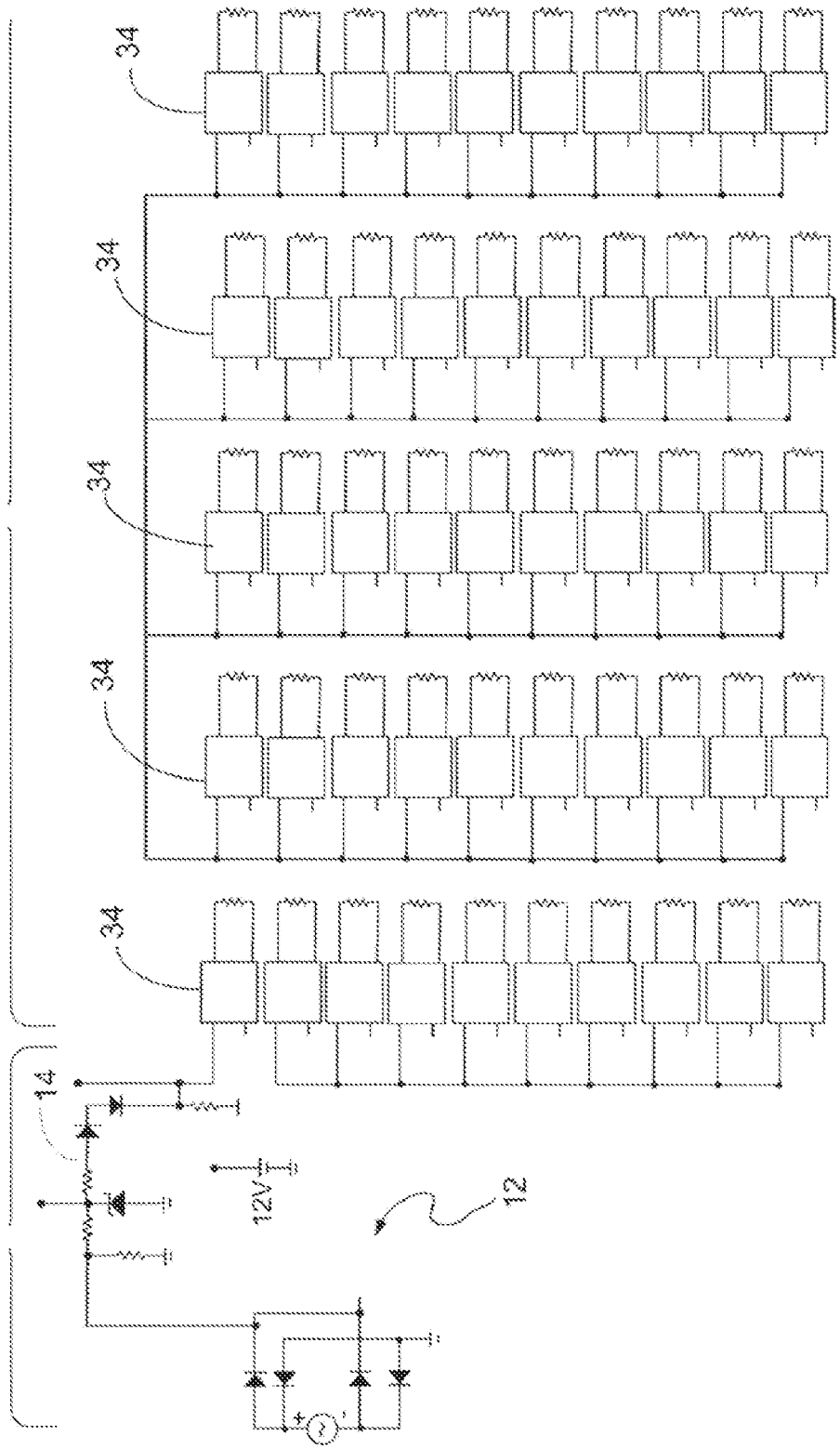
FIG. 3 is a simulation diagram of a circuit used for simulating the fault detection circuit shown in FIG. 2A with a plurality of lampheads.

The present invention is directed to a method and apparatus adapted to detect lamphead failures in an emergency lighting system. Single lamp failures can be detected and associated with a particular lamphead in accordance with the present invention. The apparatus preferably requires only two power cables or connections that typically connect the battery unit and lamphead to transmit a failure signal without needing any additional wiring in case of a mains power failure.

Alternative methods of detecting failures in emergency lighting systems utilize impedance measurements of a multi-lamp circuit. A slightly higher value than the measured impedance value, such as 10% more than the measured value, is preferably stored in memory as a threshold. This threshold is then preferably compared by a microcontroller with future measurements of the impedance, which if higher trigger an alarm condition that indicates a failure in the particular multi-lamp circuit being tested.

The advantages of this approach include simplicity of operation; the ability to use standard, unaltered lampheads; and automatic calibration of impedance measurements. Unfortunately, this solution is only efficient for use with emergency lighting systems having a few lampheads. Further, this approach suffers from only a generalized lamp failure that cannot specify the particular lamphead or lampheads that have failed. If such an approach is used in large emergency lighting systems, the resulting lack of resolution in impedance changes may mean that several lampheads must fail before any one failure becomes detectable.

The apparatus formed in accordance with the present invention preferably incorporates a limited impedance signal generator, which is located on a battery charger board, and a lamp failure detection circuit located in each lamphead. When a lamphead failure occurs, the failed lamphead preferably pulls down or reduces the voltage of a pulsed or time-varying monitoring signal provided by the signal generator. The peak value of the monitoring signal is then preferably detected by a microcontroller, compared to the normal value of the monitoring signal, and used to indicate failure in at least one of the lampheads.

Thus, the apparatus only requires the two power wires ordinarily used to provide power to each of the lampheads and can preferably operate with 6-24 volts and any number of lampheads. The apparatus is also independent of lamp power or size. The microcontroller can also filter the monitoring signal to avoid false indications of failure, which may be caused by extraneous noise on the monitoring signal. The microcontroller preferably compares the monitoring signal to the normal value substantially continuously when the battery is being charged, periodically, and/or upon user request at other times. The failure detection circuit located in the lamphead preferably has a reduced footprint of less that about one (1) square inch by, for example, using surface mount technology to minimize impact on the retrofit of existing lampheads.

The type and/or quantity of information transmitted between the lampheads and battery charger may be augmented or enhanced by incorporating, for example, a microcontroller in the failure detection circuit located in the lamphead that encodes such information on the power lines. In this way, transmitted information may be tagged with the identity of the source of the information, which would substantially simplify the service of lampheads by enabling failed lampheads to be found without a time-consuming physical search of the facility. Likewise, information transmitted by, for example, the battery charger could be tagged with the identity of its source, intended recipient, and/or destination.

FIGS. 1A and 1B are block diagrams of a failure detection system formed in accordance with the present invention and adapted for use in an emergency lighting system. A power signal 12 is preferably provided to a centrally located signal generation circuit 14 that is remote to the lampheads. A lamp fail sensing signal or monitoring signal 18 is provided to a microcontroller-based battery charger 20 that is also preferably located remotely from the individual lampheads. The microcontroller preferably controls a silicon controlled rectifier SCR1 that provides gating for a battery V1 to be charged by the power signal 12. In transfer mode, when there is an AC power failure, switch SW1 is preferably closed to provide battery backup power to the lamp 16 from the battery V1.

In accordance with the present invention, a failure detection circuit 22 shown in FIG. 1B is preferably substituted for the lamp 16 shown in FIG. 1A across nodes A and B in each of the lampheads. The failure detection circuit 22 preferably includes a fail sense circuit 24, a gate drive circuit 26, a MOSFET 28, a resistor R5, and a transistor Q3. The fail sense circuit 24 preferably detects whether there is a lamp failure, for example, whether the lamp presents an open circuit. The gate drive circuit 26 preferably provides a gate driving signal to the MOSFET 28 with appropriate electrical characteristics.

FIG. 2 shows a more detailed schematic diagram of the failure detection circuit 10, which is preferably located in each of the lampheads of an emergency lighting system. The power signal 12 is preferably provided by an AC signal generator 30 and is full-wave rectified by four (4) diodes D1-D4 configured as a full-wave bridge circuit 32.

The signal generation circuit 14 preferably includes resistors R3, R4, R5, R71, R1, diodes D7, D12, D13, and transistor Q3. Resistors R71, R3, and diodes D12, D13, are preferably electrically connected in series. Resistor R1 is preferably connected from the power signal 12 to ground. Zener diode D7 is preferably connected to a point between resistors R71, R3 and ground. Resistor R4 is connected to a point between resistor R3 and the anode of diode D12 and ground. Resistor R5 is preferably connected to the collector of transistor Q3. The emitter of transistor Q3 is connected to ground.

The fail sense circuit includes resistors R6, R7, R8, R10, transistor Q4, and diode D11. Resistors R7, R8 are preferably connected in series between the base of transistor Q3 and the collector of transistor Q4. The emitter of transistor Q4 is preferably connected to resistor R5, and the base of transistor Q4 is connected to resistor R8. The lamp 16 is preferably connected in series between diode D13 and resistor R8. Diode D11 is connected to a point between resistors R6, R7 and a resistor R10. Resistor R10 is preferably connected in series from the cathode of diode D11 to ground.

Transistors Q3 and Q4 are preferably used to detect an open lamp circuit or failed lamp 16. If the lamp 16 has failed, the monitoring signal will preferably have a peak voltage of about 1.2 V. If the lamp 16 is operable, the monitoring signal will preferably have a peak voltage of about 3.2 V. Transistor Q4 is preferably implemented as a high gain transistor, such as 2N5087, which helps maintain the loading of the complete circuit high. A high gain transistor is able to work at a lower current and consequently higher resistance values can be used in the detection circuit. Transistor Q3 is preferably configured as a generator pump. Diode D11 is preferably used to stop transistor Q3 from turning on in transfer mode when battery backup is being supplied to the lamp 16.

The gate drive circuit 26 preferably includes transistors Q1, Q2, diodes D6, D9, D10, resistors R11, R12, R13, and capacitor C2. The anode of diode D9 is connected to the cathode of diode D13, the anode of Zener diode D10 is connected to resistors R11, R12; and the cathodes of diode D9 and Zener diode D10 are preferably connected to each other. The emitter of transistor Q1 is also connected to the cathode of diode D13 and the anode of diode D9; and the base of transistor Q1 is connected to the collector of transistor Q2 and the cathodes of diodes D9, D10. The collector of transistor Q1 is connected to the base of transistor Q2 and resistor R13. Resistors R13, R12 are connected in series between the base of transistor Q2 and ground. Resistor R11 is connected in series between the emitter of transistor Q2 and the gate of MOSFET Q5. Capacitor C2 is connected from the gate of MOSFET Q5 and ground. The cathode of Zener diode D6 is connected to the gate of MOSFET Q5, and the anode of Zener diode is connected to ground.

It is desirable for the circuit shown in FIG. 2 to exhibit good stability over a temperature range of about 0-100° C. The upper portion of this range is highly possible due to proximity of the circuit to the lamp 16. Performance and stability of the circuit is improved if $h_{fe}$ is stable by using transistors, such as 2N4403. Use of general purpose transistors, such as 2N3904, as transistors Q2 and Q4 exhibit poor performance at extreme temperatures due to variations in the gain ($h_{fe}$) of the transistor over temperature.

The MOSFET 28 is preferably chosen with $V_{DS}$ about 60V and current high enough to handle an inrush current from the lamp ($I_{Dpulse}$). Also, the zero voltage drain current ($I_{DSS}$) of the MOSFET is preferably chosen with the lowest possible value since this will sink current in standby mode, which will enable the highest number of lampheads to be used with the detection circuit.

In normal mode, when the lamp 16 is operational, a rectified 3.2-volt peak voltage (shown in FIG. 2B) is preferably present at node C as the monitoring signal. The microcontroller in the charging unit 20 (shown in FIG. 1A) preferably interprets this voltage as indicating that the lamp 16 is operational preferably using an analog-to-digital input. Transistor Q4 is maintained in an off state by current flowing through resistor R8 and the lamp 16. No current is provided at the base of transistor Q4 since voltage at the admitter of Q4 is equal to voltage at the base of Q4 in the off state. Therefore, transistor Q3 is also in the off state. In addition, power MOSFET Q5 and the associated drive circuitry 26 are off.

In the lamp failure mode, when the lamp 16 is not operational, transistor Q4 is preferably turned on with base current from resistors R8, R10 which provide connections to ground. This current is provided to the base of transistor Q3, which turns transistor Q3 on as well. With current leaking through both transistors Q3 and Q4, voltage provided at node C as the monitoring signal is reduced to no more than approximately 1.5 volts (shown as in FIG. 2A) which is substantially less than the peak voltage of the monitoring signal shown in FIG. 2B during the normal mode. The microcontroller in the charging unit 20 (shown in FIG. 1A) preferably interprets this voltage as indicating that the lamp 16 is not operational.

When the lamp 16 is operational and in transfer mode, that is, when battery backup is being provided by battery V1, power to the gate drive circuit 26 is preferably on through action of the current polarizing diode D10, which maintains the base current of transistor Q1 by ensuring about 4.7V across the collector and emitter of transistor Q2 forcing transistor Q2 into saturation. Transistor Q1 is preferably used as positive feedback from transistor Q2, which drives transistor Q1 deeper into saturation. Thus, the gate drive circuit 26 will turn off when the base current to transistor Q2 and its gain ($h_{FE}$) are too low. This preferably occurs at about 1.7V. Capacitor C2 with resistor R11 preferably smooth any effect of relay bounce to drives the MOSFET Q5 with a ramp signal. Transistor Q3 in the fail sense circuit 24 is preferably kept off with diode D11, which preferably drains current coming from transistor Q4 as it is turned on. Failure of the lamp is preferably not detected while in transfer mode.

FIG. 3 is a schematic diagram of a circuit used for simulating the fault detection circuit 10 with a plurality of lampheads 34.

Thus, the apparatus and method for failure detection formed in accordance with the present invention provides is able to detect and identify failure of individual lampheads in an emergency lighting system using only the wires ordinarily used to provide power to the lampheads. The apparatus and method is also able to operate with voltages from about 6-24V and is independent of lamp power or size.

Although illustrative embodiments of the present invention have been described herein with reference to the accompanying drawings it is to be understood that the invention is not limited to those precise embodiments, and that various other changes and modifications may be affected therein by one skilled in the art without departing from the scope or spirit of the invention.

What is claimed is:

1. An apparatus adapted to detect a failure in at least one lamphead of an emergency lighting system, the lamphead receiving power from a power connection, the apparatus comprising:
    a signal generator, the signal generator generating a monitoring signal comprising a voltage, the monitoring signal being operatively coupled to the power connection; and
    a failure sensor, the failure sensor being adapted to detect a failure in the at least one lamphead, the failure sensor modifying the voltage of the monitoring signal in response to detection of the failure in the at least one lamphead, thereby indicating the failure of the at least one lamphead.

2. The apparatus adapted to detect a failure in at least one lamphead of an emergency lighting system as defined by claim 1, wherein the emergency lighting system comprises a plurality of lampheads, the failure sensor being adapted to detect a failure in at least one of plurality of lampheads, the failure sensor being adapted to identify which of the plurality of lampheads has failed.

3. The apparatus adapted to detect a failure in at least one lamphead of an emergency lighting system as defined by claim 1, wherein the failure sensor is adapted to reduce the voltage of the monitoring signal in response to detection of the failure in the at least one lamphead.

4. The apparatus adapted to detect a failure in at least one lamphead of an emergency lighting system as defined by claim 1, wherein the apparatus is coupled to the power connection without additional wiring to enable indication of failure in the at least one lamphead.

5. The apparatus adapted to detect a failure in at least one lamphead of an emergency lighting system as defined by claim 1, wherein the power connection comprises two power cables.

6. The apparatus adapted to detect a failure in at least one lamphead of an emergency lighting system as defined by claim 1, wherein the monitoring signal comprises at least one of a pulsed signal and a time-varying signal.

7. The apparatus adapted to detect a failure in at least one lamphead of an emergency lighting system as defined by claim 1, wherein the failure sensor comprises a microcontroller.

8. The apparatus adapted to detect a failure in at least one lamphead of an emergency lighting system as defined by claim 1, wherein the failure sensor is adapted to encode information on a power signal, the information being associated with the failure in the at least one lamphead.

9. The apparatus adapted to detect a failure in at least one lamphead of an emergency lighting system as defined by claim 1, wherein the monitoring signal is filtered to reduce false indications of failure in the at least one lamphead.

10. The apparatus adapted to detect a failure in at least one lamphead of an emergency lighting system as defined by claim 1, wherein the apparatus is adapted to operate with 6 volts to 24 volts.

11. A method adapted to detect a failure in at least one lamphead of an emergency lighting system, the lamphead receiving power from a power connection, the method comprising:
generating a monitoring signal comprising a voltage;
coupling the monitoring signal operatively to the power connection;
detecting a failure in the at least one lamphead; and
modifying the voltage of the monitoring signal in response to detection of the failure of the at least one lamphead, thereby indicating the failure of the at least one lamphead.

12. The method adapted to detect a failure in at least one lamphead of an emergency lighting system as defined by claim 11, wherein the emergency lighting system comprises a plurality of lampheads, the method further comprising:
detecting a failure in at least one of plurality of lampheads; and
identifying which of the plurality of lampheads has failed.

13. The method adapted to detect a failure in at least one lamphead of an emergency lighting system as defined by claim 11, further comprising reducing the voltage of the monitoring signal in response to detection of the failure of the at least one lamphead.

14. The method adapted to detect a failure in at least one lamphead of an emergency lighting system as defined by claim 11, further comprising coupling the apparatus to the power connection without additional wiring to enable indication of failure in the at least one lamphead.

15. The method adapted to detect a failure in at least one lamphead of an emergency lighting system as defined by claim 11, wherein the power connection comprises two power cables.

16. The method adapted to detect a failure in at least one lamphead of an emergency lighting system as defined by claim 11, wherein the monitoring signal comprises at least one of a pulsed signal and a time-varying signal.

17. The method adapted to detect a failure in at least one lamphead of an emergency lighting system as defined by claim 11, wherein the failure sensor comprises a microcontroller.

18. The method adapted to detect a failure in at least one lamphead of an emergency lighting system as defined by claim 11, further comprising encoding information on a power signal by the failure sensor, the information being associated with the failure in the at least one lamphead.

19. The method adapted to detect a failure in at least one lamphead of an emergency lighting system as defined by claim 11, further comprising filtering the monitoring signal to reduce false indications of failure in the at least one lamphead.

20. The method adapted to detect a failure in at least one lamphead of an emergency lighting system as defined by claim 11, further comprising operating the apparatus with 6 volts to 24 volts.

* * * * *